(12) United States Patent
Baldwin et al.

(10) Patent No.: US 6,402,901 B1
(45) Date of Patent: Jun. 11, 2002

(54) SYSTEM AND METHOD FOR PERFORMING SPUTTER DEPOSITION USING A SPHERICAL GEOMETRY

(75) Inventors: David Alan Baldwin, Annadale; Todd Lanier Hylton, Great Falls, both of VA (US)

(73) Assignee: 4 Wave, Inc., Alexandria, VA (US)

( * ) Notice: Subject to any disclaimer, the term of this patent is extended or adjusted under 35 U.S.C. 154(b) by 0 days.

(21) Appl. No.: 09/810,809

(22) Filed: Mar. 16, 2001

(51) Int. Cl.[7] .............................................. C23C 14/34
(52) U.S. Cl. .............................. 204/192.11; 204/298.04; 204/298.26
(58) Field of Search ...................... 204/192.11, 298.04, 204/298.15, 298.26

(56) References Cited

U.S. PATENT DOCUMENTS

| | | | |
|---|---|---|---|
| 3,793,179 A | * | 2/1974 | Sablev et al. .......... 204/298.41 |
| 4,250,009 A | * | 2/1981 | Cuomo et al. ......... 204/192.11 |
| 4,834,856 A | | 5/1989 | Wehner |
| 4,872,922 A | | 10/1989 | Bunker et al. |
| 4,923,585 A | * | 5/1990 | Krauss et al. .......... 204/298.04 |
| 4,968,006 A | | 11/1990 | Oliver |
| 5,098,483 A | | 3/1992 | Little et al. |

* cited by examiner

Primary Examiner—Rodney G. McDonald
Assistant Examiner—Gregg Cantelmo
(74) Attorney, Agent, or Firm—Morgan, Lewis & Bockius LLP

(57) ABSTRACT

A system and method for simultaneously performing sputter deposition on a plurality of planar substrates. An ion current source generates an ion beam in which ions are directed toward a target. The target is formed from a section of a sphere. Each of the plurality of planar substrates has a deposition surface that is tangent to a surface of the sphere. In addition, a substrate that is a section of a sphere may be used. The deposition thickness across the spherically-shaped substrate is uniform.

20 Claims, 6 Drawing Sheets

US 6,402,901 B1

SYSTEM AND METHOD FOR PERFORMING SPUTTER DEPOSITION USING A SPHERICAL GEOMETRY

FIELD OF THE INVENTION

The present invention is directed generally to novel systems and methods for performing sputter deposition, and to optical devices manufactured using such systems and methods.

BACKGROUND OF THE INVENTION

The present invention relates to ion beam sputter deposition (IBSD). More particularly, the present invention concerns a system and method for performing sputter deposition using a divergent ion beam source. It is believed that IBSD is a technique common in the manufacturing of optical filters.

The method is normally carried out in a vacuum environment by bombarding a target with an ion current. The bombardment results in the dislodging of atoms from the target which are then deposited as a film on a substrate. IBSD is an improvement over other types of sputter deposition techniques because it produces films that are of high quality with improved adhesive properties. IBSD produces films that have a density very similar to the bulk density of the materials used and a surface roughness which is equal to that of a super-polished substrate. These results are advantageous for optical coatings.

Performance of optical filters is further improved with deposition thickness that is uniform across the substrate. The disclosed process provides such an improvement.

SUMMARY OF THE INVENTION

In accordance with a first aspect, the present invention is directed to a system and method for simultaneously performing sputter deposition on a plurality of planar substrates. An ion current source generates an ion beam in which ions are directed toward a target. The target is formed from a first section of a sphere. Each of the plurality of planar substrates has a deposition surface that is tangent to a surface of other sections of the same sphere. In one embodiment, the plurality of planar substrates are arranged as a mosaic of tiles arranged generally about the surface of another section(s) of the sphere. As a result of the spherical shape of the target and the arrangement of the planar substrates on the surface of the same sphere, substrates that are small compared to the radius of the sphere receive a substantially uniform deposition thickness that is substantially the same for each of the plurality of planar substrates. In accordance with further embodiments, a plurality of targets each of which is formed from a section of the sphere are used, and the target is negatively biased during operation of the system.

In accordance with a still further aspect, the present invention is directed to a system and method for performing sputter deposition on a spherically-shaped substrate. In this embodiment, an ion current source generates an ion beam in which ions are directed toward a target (e.g., a negatively biased target) that is formed from a first section of a sphere. A spherically-shaped substrate is disposed along a second section of the same sphere. As a result of the spherical shape of the substrate and its positioning on the same sphere as the spherically-shaped target, the deposition thickness distribution over the spherically-shaped substrate remains substantially uniform during operation of the system.

In an embodiment useful for affecting uniform wear of the target during operation of the either of the systems described above, the ion current source used for implementing the system is a divergent ion beam source that generates a divergent ion beam, and the discharge surface of the ion source is placed on the surface of the sphere in which the spherically-shaped target lies. The divergent ion beam source has a central axis positioned along a radius of the sphere. The ion current produced by the divergent ion beam source varies throughout the divergent ion beam in accordance with (or substantially in accordance with) the equation:

$$\text{ion current} = J_0 \cos(\theta);$$

where $\theta$ is an angle between the central axis and a direction of the ion current, and $J_0$ is an ion current density along the central axis. In this embodiment, the ion current density arriving at each portion of the spherically-shaped target is substantially identical, which in certain circumstances (e.g., a low energy ion source and a large negative bias on the target) will produce a uniform sputtering rate over the target surface.

The present invention is further directed to an optical filter that results from the practice of the disclosed systems and methods.

BRIEF DESCRIPTION OF THE DRAWINGS

The accompanying drawings, which are incorporated herein and constitute part of this specification, illustrate presently preferred embodiments of the invention, and, together with the general description given above and the detailed description given below, serve to explain features of the invention. In the Drawings.

DETAILED DESCRIPTION OF THE PREFERRED EMBODIMENTS

Figure 1A:
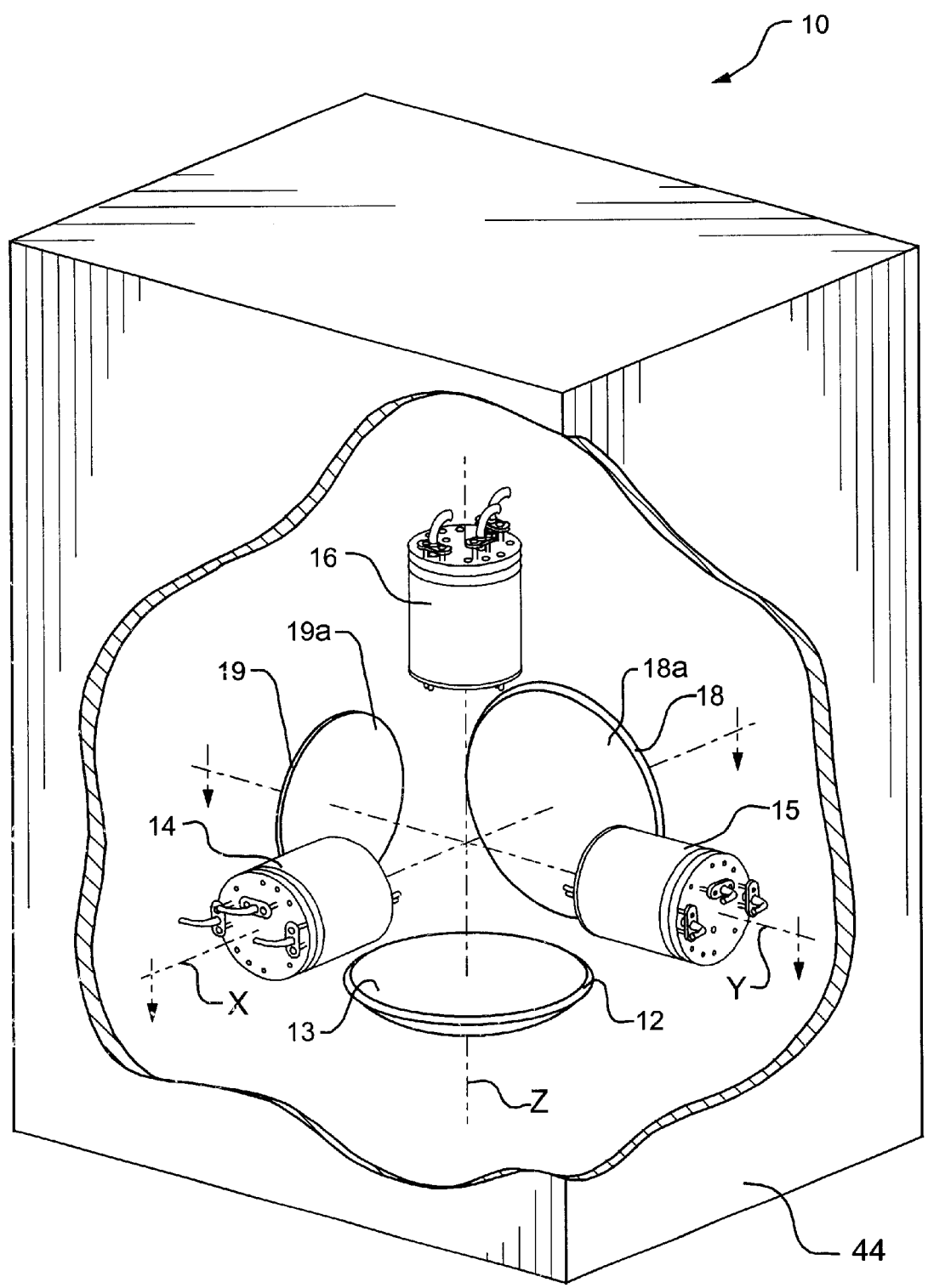
FIG. 1A is a diagram of a system for performing sputter deposition using a spherical geometry that includes both a spherically-shaped target and a spherically-shaped substrate, according to the present invention.
Figure 1B:
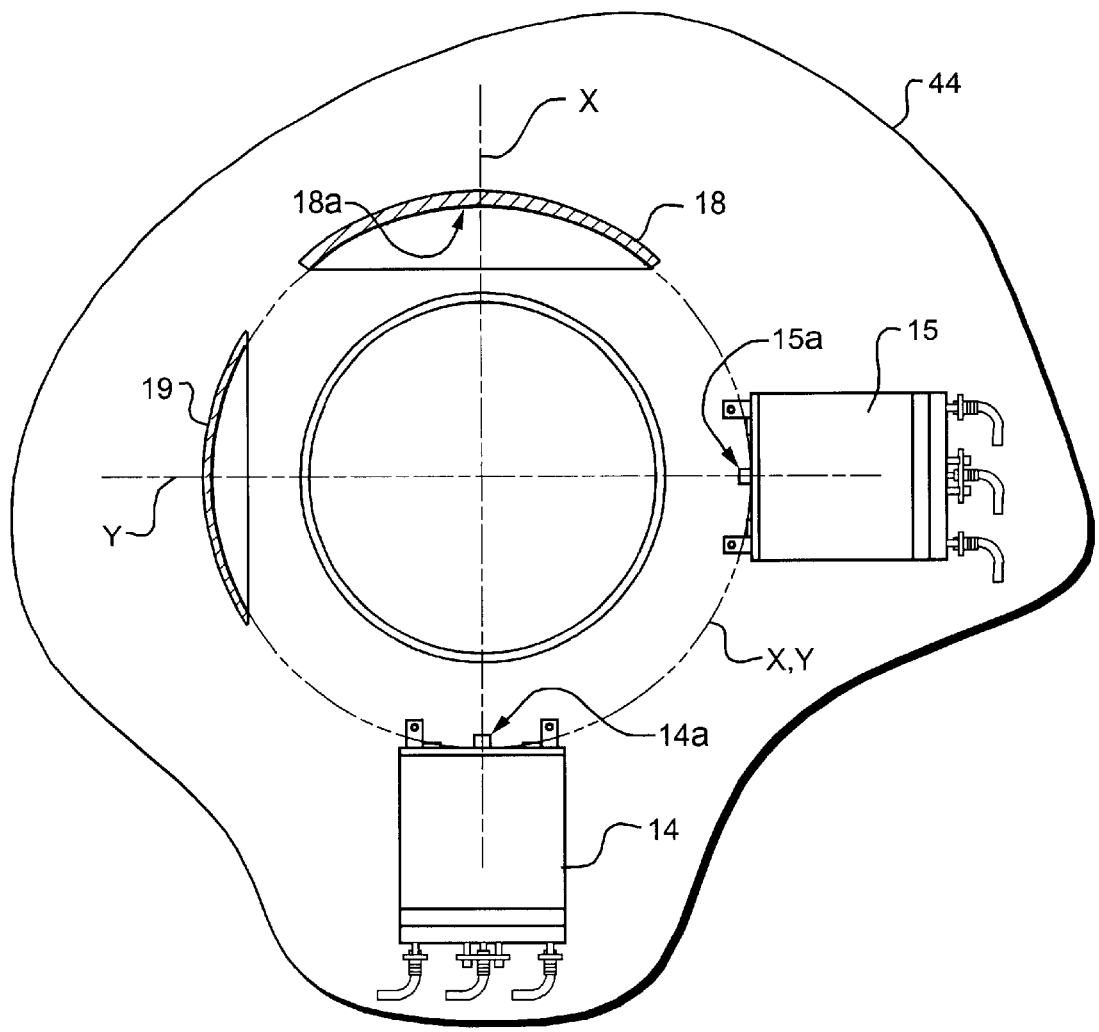
FIG. 1B shows a cross-section of the system shown in FIG. 1A.

There is shown in FIGS. 1A–1B, a system 10 for performing sputter deposition on a spherically-shaped substrate 12. The system 10 comprises at least one ion current source 14 having a central axis X about which ions are directed toward a spherically-shaped target 18. In an embodiment useful for affecting uniform wear of target 18, ion current source 14 may be of the Hall-current-type or any ion source with a largely diffusive flux of ions out of a region of concentrated plasma which are well know in the art. These types of sources are based upon gaseous ionization and are able to provide amperes of ion current. Ion source 14 is optionally able to generate its charged particles independently and in the absence of the other sources or plasma processes in vacuum chamber 44. Ion current source 14 further has a discharge surface 14A that is positioned on a reference sphere XY. Central axis X passes through discharge surface 14A (preferably at the center point of surface 14A) and lies along a radius of reference sphere XY. Sphere XY is referred to herein as a "reference" sphere, because it is not a tangible sphere, but rather a virtual construct that provides relative spatial and geometric reference for the various elements of the present invention. The term "sphere" is used at times herein to refer to reference sphere XY, rather than a tangible sphere.

The target 18 has a spherically-shaped inner surface 18A that is disposed along a section of reference sphere XY. Target 18 may made from any type of material well known in the art such as the following metals: Cu, Ti, Al, Ni or Fe or any of the following dielectrics: $Al_2O_3$, $SiO_2$ or $TiO_2$. When a divergent ion beam is produced by the ion current source 14, the divergent ion beam is characterized by an ion current that varies in accordance with (or approximately in accordance with) the equation:

$$\text{ion current} = J_0 \cos(\theta); \quad (1)$$

where $\theta$ is an angle between the central axis X and a direction of the ion current, and $J_0$ is an ion current density produced by ion source 14 along the central axis X.

In system 10, substrate 12 has a spherically-shaped inner surface 13 (of equal radius to the target inner surface 18A) that is disposed along a section of the reference sphere different from that occupied by target 18. The substrate 12 may be made from any type of material well known in the art such as Si or glass.

In the embodiment of FIGS. 1A–1B, the system also includes a second ion current source 15 having a central axis Y about which ions are directed toward a second spherically-shaped target 19, and a third ion current source 16 having a central axis Z about which ions are directed toward spherically-shaped substrate 12. The target 19 has a spherically-shaped inner surface 19A that is disposed along a section of reference sphere XY that is different from the sections occupied by target 18 and substrate 12. Ion current sources 14, 15, 16, respectively, each have a discharge surface 14A, 15A, 16A, respectively, each of which is positioned on reference sphere XY. Central axis Y passes through discharge surface 15A (preferably at the center point of surface 15A) and lies along a radius of reference sphere XY, and central axis Z passes through discharge surface 16A (preferably at the center point of surface 16A) and lies along a radius of reference sphere XY.

System 10 may be advantageously used to improve the uniformity of deposition thickness on substrate 12. Because of the spherical geometry and the typical spatial flux distribution of atoms sputtered from a surface, each portion of the target(s) independently coats the surface of the spherical substrate uniformly. Because of this, the deposited film uniformity is independent of the relative sputtering rate of different segments of the target(s). This arrangement therefore provides a highly robust solution for uniform deposition.

In an embodiment useful for affecting uniform wear of targets 18 and 19 and applying uniform ion flux to substrate 12, ion current sources 14, 15 and 16 are all divergent beam ion sources characterized by an ion current that varies in accordance with (or approximately in accordance with) the equation: ion current=$J_0 \cos(\theta)$; where $\theta$ is an angle between the central axis of the ion source and a direction of the ion current, and $J_0$ is an ion current density produced by the ion source along its central axis. In the embodiment shown, axes X, Y and Z are each orthogonal to the other two axes, although other geometries are possible and desirable depending on the application.

Figure 2A:
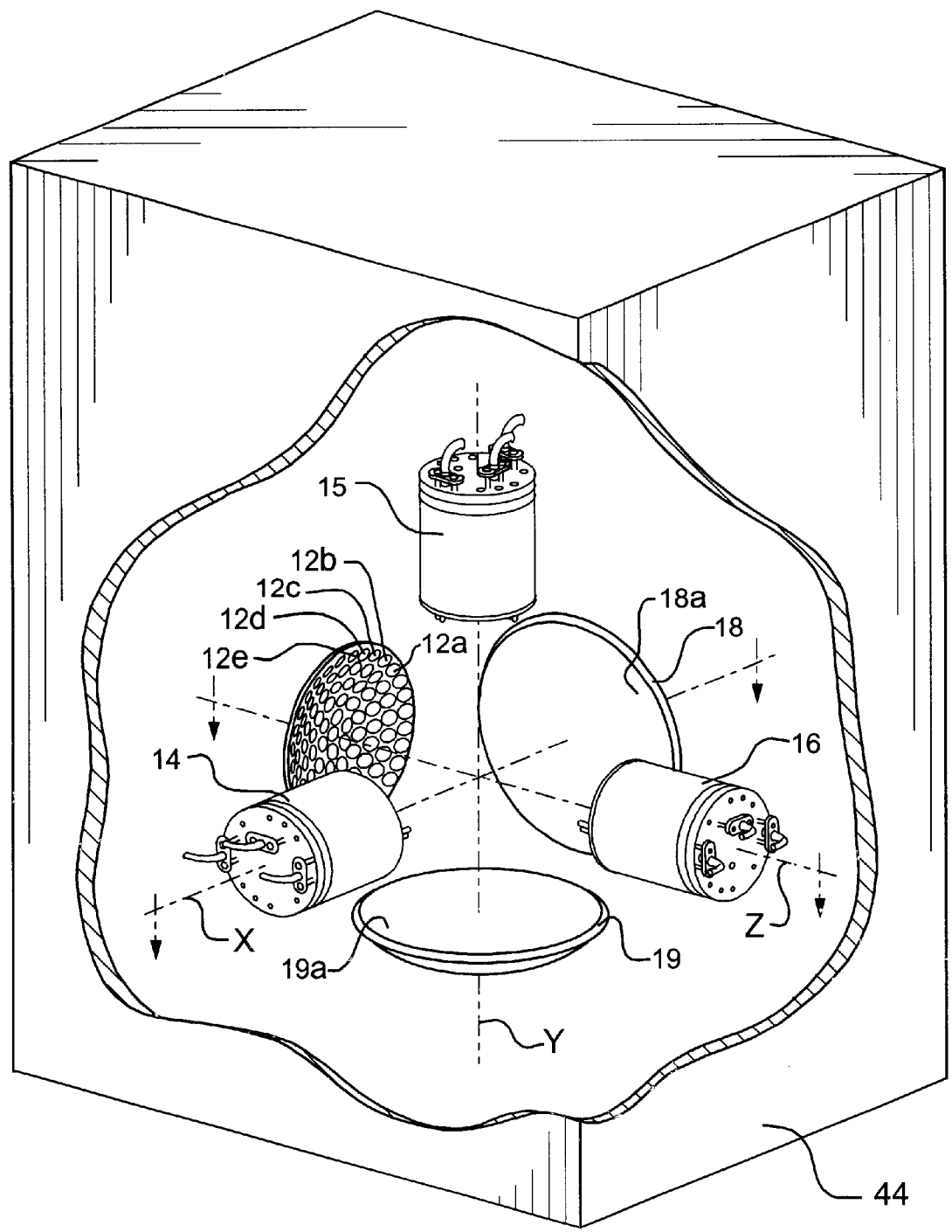
FIG. 2A is a diagram of a system for performing sputter deposition using a spherical geometry that includes a spherically-shaped target and a plurality of planar substrates arranged as tiles along the surface of the sphere, according to an alternate embodiment of the present invention.
Figure 2B:
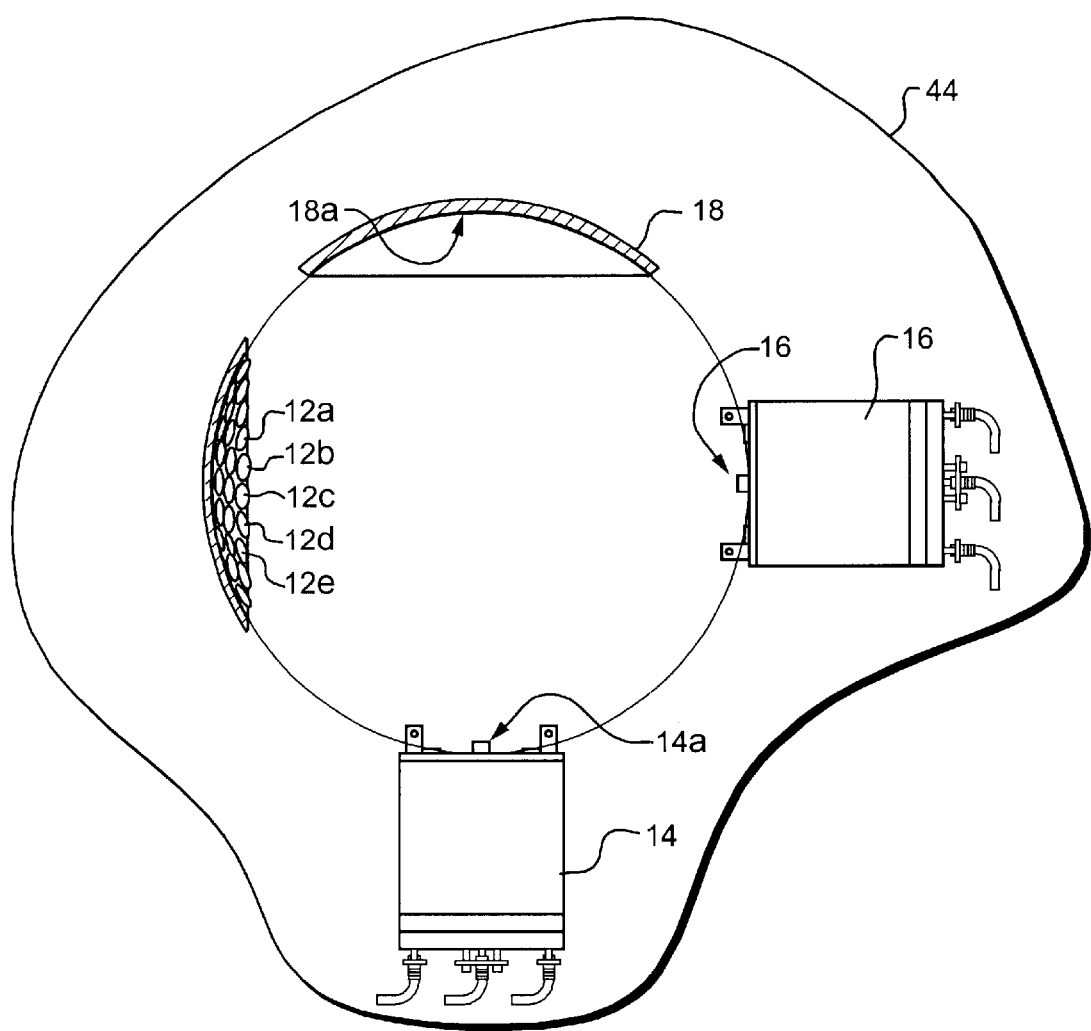
FIG. 2B shows a cross-section of the system shown in FIG. 2A.

Referring now to FIGS. 2A–2B, there is shown a diagram of a system for performing sputter deposition using a spherical geometry that includes a spherically-shaped target and a plurality of planar substrates arranged as tiles along the surface of the sphere, according to an alternate embodiment of the present invention. The system of FIGS. 2A–2B is substantially the same as the system of FIGS. 1A–1B. However, in contrast to the system of FIGS. 1A–1B where the substrate 12 had a spherical deposition surface, in the system of FIGS. 2A–2B, sputter deposition is simultaneously performed on a plurality of planar substrates 12a, 12b, 12c, 12d, and 12e. The plurality of planar substrates 12a, 12b, 12c, 12d, and 12e are arranged in the embodiment shown as a mosaic of tiles arranged generally about the surface of reference sphere XY, and each of the planar substrates 12a, 12b, 12c, 12d, and 12e has a deposition surface that is tangent to the surface of reference sphere XY. In the embodiment of FIGS. 2A–2B, the deposition thickness and thickness distribution across each given one of the plurality of planar substrates 12a, 12b, 12c, 12d, and 12e is identical (or substantially identical). The deposition thickness distribution across each given substrate varies in accordance with (or approximately in accordance with) the equation:

$$R^3/(R^2+a^2)^{3/2} \quad (2)$$

where "R" is the radius of the reference sphere XY and "a" is one-half of a maximum width of the given planar substrate.

Figure 3:
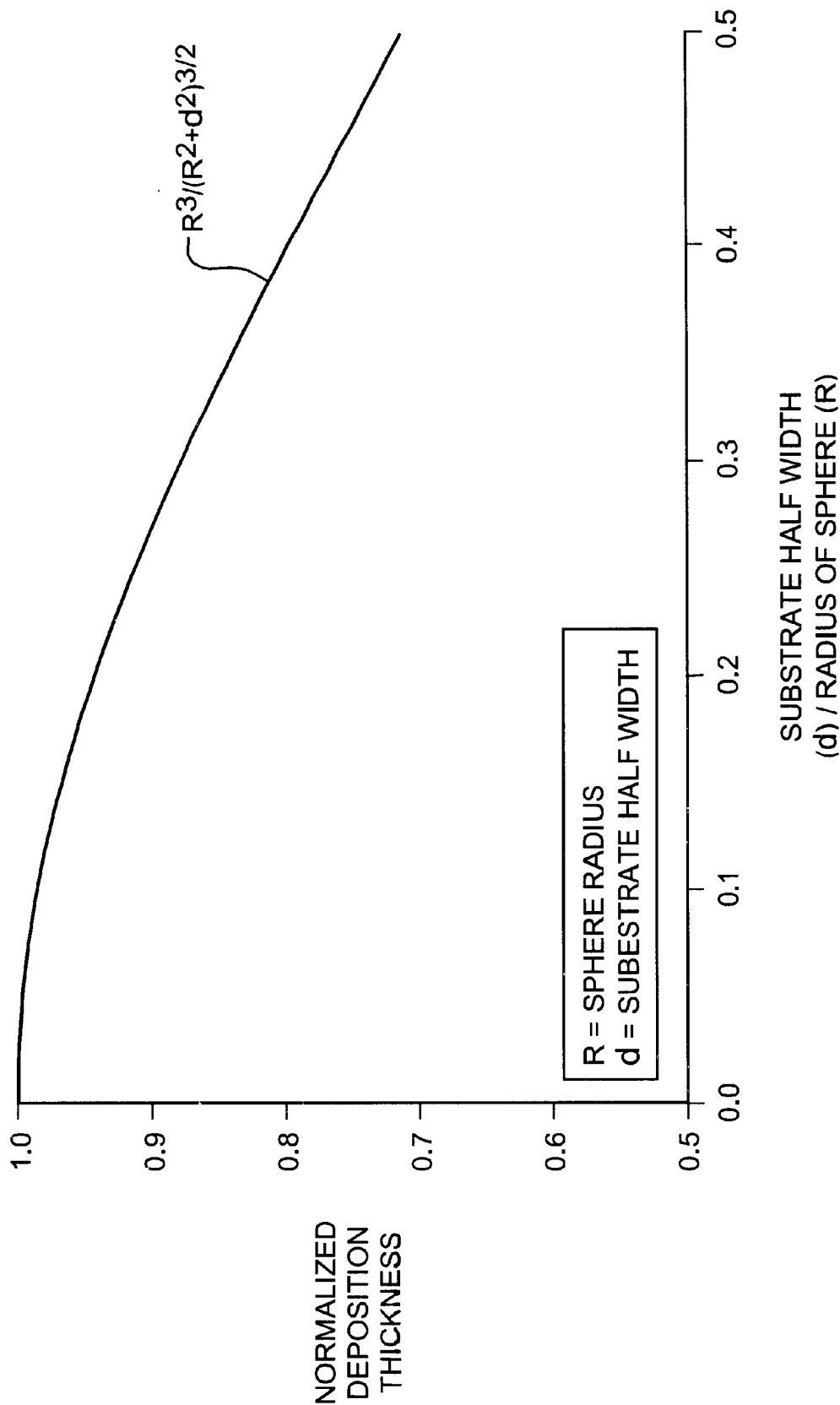
FIG. 3 entitled Deposition Thickness Uniformity of Planar Substrates in a Spherical Sputtering Geometry, is a chart that illustrates the relationship between the "substrate half width (d)/radius of sphere (R)" vs. the "normalized deposition thickness" according to the present invention.

FIG. 3 illustrates a uniform deposition thickness distribution achieved over one of the planar substrates using a spherical sputtering geometry such as the one described above in FIGS. 2A–2B. For planar substrates that are small compared to the radius "R" of the sphere XY, the deposition distribution over the substrate is substantially uniform.

Uniformity as used herein means the minimum deposition thickness over a substrate divided by the maximum deposition thickness over the same substrate. For purposes of this application, the deposition thickness shall be deemed uniform so long as the above ratio exceeds 95%.

Substantially uniform film thickness, as described by Equation 1, can be produced on planar substrates of various shapes and sizes using the system shown in FIGS. 2A–2B. For example, in the case of a planar substrate, where the substrate radius (i.e. "half-width") is much less than the radius of the sphere XY, the normalized deposition thickness approaches 1.0. Where, in this example, the planar substrate radius is increased in relationship to the radius of the sphere, the non-uniformity of the deposition thickness distribution increases over a given substrate in accordance with Equation 1. However, the deposition thickness and thickness distribution from substrate to substrate in a given "mosaic" of planar substrates simultaneously processed using the system of FIGS. 2A–2B remains identical or substantially identical. A practitioner who is skilled in the art will recognize that this novel approach enables one to produce a selected film thickness uniformity by varying the size of the substrate in relationship to the dimensions of the sphere.

The practitioner may elect to configure the system of FIGS. 1A–1B or FIGS. 2A–2B with only one target, or without an ion source directed at the substrate.

The present invention also includes novel methods for performing sputter deposition using the systems shown in FIGS. 1A–1B and 2A–2B. In a first of these methods, sputter deposition is performed on a spherically-shaped substrate 12 using at least a portion of the components shown in FIGS. 1A–1B. In this embodiment, an ion current source 14 generates an ion beam in which ions are directed toward a target (e.g., a negatively biased target) 18 that is formed from a first section of a reference sphere XY. Spherically-shaped substrate 12 is disposed along a second section of the reference sphere XY. As a result of the spherical shape of the substrate and its positioning on the same reference sphere as the spherically-shaped target 18, the deposition thickness distribution over the spherically-shaped substrate 12 remains substantially uniform during the deposition process.

In a second of these methods, sputter deposition is performed simultaneously on a plurality of planar substrates (e.g., 12a, 12b, 12c, 12d, and 12e). In this method, an ion current source 14 generates an ion beam in which ions are directed toward a target 18. The target 18 is formed from a section of a sphere, and is disposed along a reference sphere XY. Each of the plurality of planar substrates has a deposition surface that is tangent to a surface of the reference sphere XY. The plurality of planar substrates are arranged as a mosaic of tiles arranged generally about the surface of the sphere. The deposition thickness distribution across each given one of the plurality of planar substrates varies in accordance with the equation: $R^3/(R^2+a^2)^{3/2}$; where "R" is the radius of the sphere and "a" is one-half of a maximum width of the given planar substrate. Each of the plurality of planar substrates described above has a deposition surface that is tangent to the sphere, and the target is negatively biased during operation of the system.

In the embodiments described above, various components, axes and/or surfaces are described as being tangent or normal to each other, various axes are described as passing through specific points, various surfaces are described as being spherical or planar, deposition thickness distributions are specified as conforming to certain functions, and a cosine function is specified as describing characteristics of a given divergent ion beam. It will be understood by those skilled in the art that such components, axes and/or surfaces may be slightly offset from tangent or normal (rather than being precisely tangent or normal), such axes may pass through points generally proximate the described points (rather than precisely through the specific points described above), surfaces that are described as spherical or planar may be approximately spherical or planar (rather than precisely spherical or planar), deposition thickness distributions may conform approximately (rather than precisely) to the specified functions, and a function that approximately conforms to a cosine function may be used to describe the divergent ion beam. Such deviations represent a matter of design choice (e.g., in certain applications requiring less precision greater deviation from the exact limitations described above may be tolerated), and such deviations are within the scope of the present invention.

Figure 4A:
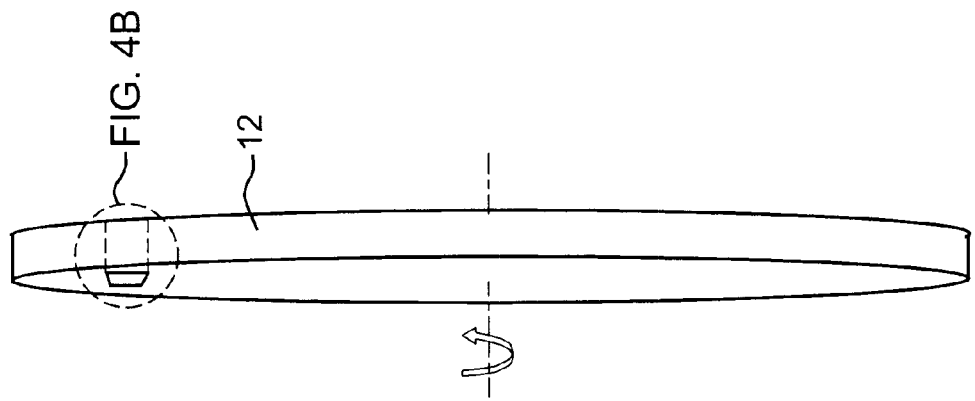
FIGS. 4A and 4B illustrate an exemplary optical filter formed using the systems and methods of the present invention.
Figure 4B:
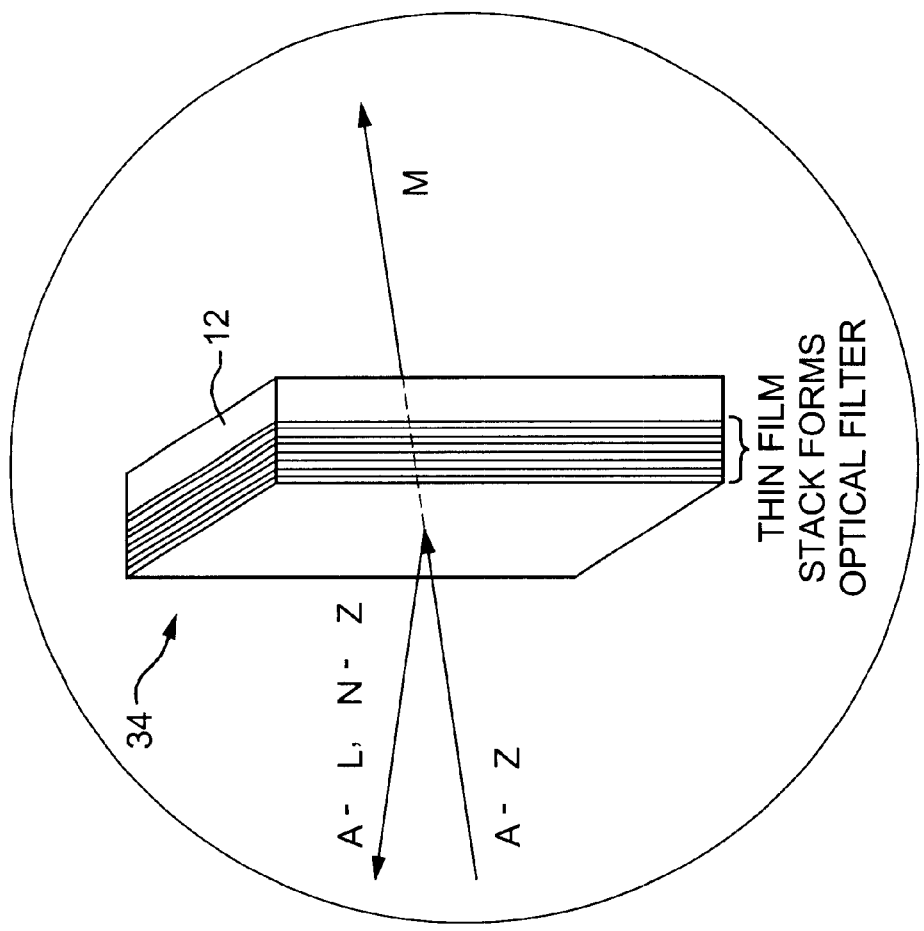

The systems and processes described above may be advantageously used to create an optical filter 34, as shown in FIGS. 4A, 4B. When the present invention is used to form an optical filter 34, the substrate is preferably formed of a glass wafer, the material deposited on the substrate is alternating layers of tantalum oxide and silicon oxide, and the thickness of the material deposited on the substrate is low-order multiples and/or fractions of the optical thickness at the wavelength of light that the filter will serve to isolate. The filter 34 may be used in the form deposited or it may be further processed by sawing, grinding, trimming, back-thinning, polishing, mounting, bonding or other means to incorporate the filter into an optic assembly. It will be evident to practitioners of the art that substrates other than glass may be used, that smaller substrate pieces may be attached to the wafer 12 for deposition of filters on the smaller pieces, that deposited materials other than tantalum oxide and silicon oxide could be used for the filter, as long as the refractive index contrast was sufficiently large, and that a variety of differing film layering designs might be employed to create a filter.

It will be appreciated by those skilled in the art that changes could be made to the embodiments described above without departing from the broad inventive concept thereof. It is understood, therefore, that this invention is not limited to the particular embodiments disclosed, but is intended to cover modifications within the spirit and scope of the present invention as defined in the appended claims.

What is claimed is:

1. A system for simultaneously performing sputter deposition on a plurality of substrates comprising:

(a) an ion current source that generates an ion beam in which ions are directed toward a spherically-shaped surface of a target, wherein said spherically-shaped surface is formed from a section of a sphere;

(b) a plurality of planar substrates; and (c) wherein each of the plurality of planar substrates has a deposition surface that is tangent to a surface of the sphere.

2. The system of claim 1, wherein the ion current source is a divergent ion beam source that generates a divergent ion beam, and the divergent ion beam source has a central axis about which ions are directed toward the target.

3. The system of claim 2, wherein the central axis is positioned along a radius of the sphere, wherein an ion current produced by the divergent ion current beam source varies throughout the divergent ion beam in accordance with the equation:

$$\text{ion current} = J_0 \cos(\theta);$$

where $\theta$ is an angle between the central axis and a direction of the ion current, and $J_0$ is an ion current density along the central axis.

4. The system of claim 1, further comprising a plurality of targets each of which is formed from a section of the sphere.

5. The system of claim 1, further comprising a plurality of ion current sources.

6. The system of claim 1, wherein the ion current source has a discharge surface disposed on the surface of the sphere.

7. The system of claim 5, wherein each of the ion current sources has a discharge surface on the surface of the sphere.

8. The system of claim 1, wherein each of the plurality of planar substrates is in the shape of a circle having a radius equal to "a".

9. The system of claim 1, wherein the target is negatively biased.

10. The system of claim 1, wherein a deposition thickness distribution across each given planar substrate in the plurality of planar substrates varies in accordance with the equation:

$$\frac{R^3}{(R^2+a^2)^{3/2}}$$

where "R" is the radius of the sphere and "a" is one-half of a maximum width of the given planar substrate.

11. A method for simultaneously performing sputter deposition on a plurality of substrates, the method comprising the steps of:
   (a) directing an ion beam from an ion current source toward a spherically-shaped surface of a sputtering target, wherein said spherically-shaped surface is formed from a section of a sphere;
   (b) providing a plurality of planar substrates; and
   (c) wherein, during step (a), each of the plurality of planar substrates has a deposition surface that is tangent to a surface of the sphere.

12. A system for performing sputter deposition on a substrate comprising:
   (a) an ion current source that generates an ion beam in which ions are directed toward a spherically-shaped surface of a target, wherein said spherically-shaped surface is formed from a first section of a sphere;
   (b) a spherically-shaped substrate disposed along a second section of the sphere; and
   (c) wherein a deposition thickness distribution over the spherically-shaped substrate is uniform during operation of the system.

13. The system of claim 12, wherein the ion current source is a divergent ion beam source that generates a divergent ion beam, and the divergent ion beam source has a discharge surface on a surface of the sphere.

14. The system of claim 13, wherein the divergent ion beam source has a central axis about which ions are directed toward the target, and the central axis is positioned along a radius of the sphere.

15. The system of claim 14, wherein an ion current produced by the divergent ion beam source varies throughout the divergent ion beam in accordance with the equation:

ion current=$J_0 \cos(\theta)$;

where $\theta$ is an angle between the central axis and a direction of the ion current, and $J_0$ is an ion current density along the central axis.

16. The system of claim 12, further comprising a plurality of spherically-shaped targets each of which is disposed along a different section of the sphere.

17. The system of claim 12, further comprising a plurality of divergent ion beam sources each of which has a discharge surface on the sphere.

18. The system of claim 12, wherein the target is negatively biased.

19. A method for performing sputter deposition on a substrate, the method comprising the steps of:
   (a) directing an ion beam from an ion current source toward a spherically-shaped surface of a sputtering target, wherein said spherically-shaped surface is formed from a section of a sphere;
   (b) providing a spherically-shaped substrate disposed along a second section of the sphere; and
   (c) wherein a deposition thickness over the spherically-shaped substrate remains uniform during step (a).

20. A system for simultaneously performing sputter deposition on a plurality of substrates comprising:
   (a) a plurality of ion current sources that generate respective ion beams each of which is directed toward a corresponding target, each target is formed from a section of a sphere;
   (b) a plurality of planar substrates; and
   (c) wherein each of the plurality of planar substrates has a deposition surface that is tangent to a surface of the sphere.

* * * * *